United States Patent
Park et al.

(10) Patent No.: US 12,414,262 B2
(45) Date of Patent: Sep. 9, 2025

(54) ELECTRONIC DEVICE HAVING COOLING MODULE AND METHOD FOR CONTROLLING COOLING MODULE THEREOF

(71) Applicant: Samsung Electronics Co., Ltd., Gyeonggi-do (KR)

(72) Inventors: Jeongwon Park, Gyeonggi-do (KR); Chulkwi Kim, Gyeonggi-do (KR); Younsang Yoo, Gyeonggi-do (KR); Jongmin Yoon, Gyeonggi-do (KR); Chanmin Park, Gyeonggi-do (KR); Donghyun Yeom, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 479 days.

(21) Appl. No.: 17/860,281

(22) Filed: Jul. 8, 2022

(65) Prior Publication Data

US 2022/0346268 A1 Oct. 27, 2022

Related U.S. Application Data

(63) Continuation of application No. PCT/KR2021/014800, filed on Oct. 21, 2021.

(30) Foreign Application Priority Data

Oct. 21, 2020 (KR) .......................... 10-2020-0136897

(51) Int. Cl.
*H05K 7/20* (2006.01)
*G06F 1/20* (2006.01)
*H05K 5/00* (2006.01)

(52) U.S. Cl.
CPC .......... *H05K 7/20209* (2013.01); *G06F 1/20* (2013.01); *G06F 1/206* (2013.01); *H05K 5/0086* (2013.01)

(58) Field of Classification Search
CPC .............. H05K 5/0086; H05K 7/20209; G06F 1/1628; G06F 1/1632; G06F 1/20; G06F 1/203; G01K 3/005
(Continued)

(56) References Cited

U.S. PATENT DOCUMENTS 9,843,206 B2    12/2017   Sato et al.
10,785,887 B2 *   9/2020   Jeong ....................... H05K 7/20
(Continued)

FOREIGN PATENT DOCUMENTS

JP     2013-150393 A     8/2013
JP     2014-110580 A     6/2014
(Continued)

*Primary Examiner* — Chun Cao
(74) *Attorney, Agent, or Firm* — Cha & Reiter, LLC.

(57) ABSTRACT

Electronic devices and methods thereof are disclosed. A first electronic device includes a housing including an inner space for receiving an external electronic device therein, a battery disposed in the housing, a detection module disposed in the housing, and configured to detect one of receiving or removal of the external electronic device from the inner space, at least one cooling module disposed in the housing, at least one processor operatively coupled with the detection module and the at least one cooling module, and a memory operatively coupled with the at least one processor, wherein the memory stores instructions which are executable by the at least one processor to detect, through the detection module, that the external electronic device is received in the housing, receive at least one of an operational state information or temperature information for the external electronic device in response to the detecting of the received external electronic device, and control the at least one cooling module, based on at least one of the operational state information or the temperature information.

20 Claims, 11 Drawing Sheets

(58) Field of Classification Search
USPC .......................................................... 700/300
See application file for complete search history.

(56) References Cited

U.S. PATENT DOCUMENTS

| | | | |
|---|---|---|---|
| 10,840,727 B1* | 11/2020 | Subero | H02J 50/80 |
| 11,411,432 B2 | 8/2022 | Lee et al. | |
| 2011/0255244 A1* | 10/2011 | Foxenland | H05K 7/20454 |
| | | | 361/688 |
| 2013/0114203 A1* | 5/2013 | Ignatchenko | G06F 1/206 |
| | | | 361/679.41 |
| 2015/0373876 A1* | 12/2015 | Berke | G05D 23/1919 |
| | | | 700/282 |
| 2016/0042202 A1 | 2/2016 | Murray et al. | |
| 2017/0060177 A1 | 3/2017 | Rahim et al. | |
| 2017/0172009 A1* | 6/2017 | Wang | G06F 1/1632 |
| 2017/0184863 A1 | 6/2017 | Balachandreswaran et al. | |
| 2018/0288898 A1* | 10/2018 | Jeong | G06F 1/206 |
| 2018/0292889 A1 | 10/2018 | Jiang | |
| 2020/0201402 A1 | 6/2020 | Lee et al. | |
| 2020/0389996 A1* | 12/2020 | Jeong | G06F 1/1632 |

FOREIGN PATENT DOCUMENTS

| | | | | | |
|---|---|---|---|---|---|
| JP | 2015-104216 A | | 6/2015 | | |
| JP | 6443663 B2 | | 12/2018 | | |
| KR | 10-2014-0065090 A | | 5/2014 | | |
| KR | 2014065090 A | * | 5/2014 | ............. | H02J 50/10 |
| KR | 10-2018-0109550 A | | 10/2018 | | |
| KR | 10-2019-0026075 A | | 3/2019 | | |
| KR | 10-2068036 B1 | | 1/2020 | | |
| KR | 10-2020-0070028 A | | 6/2020 | | |
| KR | 10-2020-0079154 A | | 7/2020 | | |
| KR | 10-2241991 B1 | | 4/2021 | | |
| KR | 10-2341356 B1 | | 12/2021 | | |
| KR | 10-2348315 B1 | | 1/2022 | | |
| WO | 2018/219240 A1 | | 12/2018 | | |

* cited by examiner

ELECTRONIC DEVICE HAVING COOLING MODULE AND METHOD FOR CONTROLLING COOLING MODULE THEREOF

CROSS-REFERENCE TO RELATED APPLICATION(S)

This application is a continuation of International Application No. PCT/KR2021/014800 filed on Oct. 21, 2021, which claims priority to Korean Patent Application No. 10-2020-0136897, filed on Oct. 21, 2020 in the Korean Intellectual Property Office, the disclosures of which are herein incorporated by reference.

TECHNICAL FIELD

Certain embodiments of the disclosure relate to an electronic device including a cooling module and a method for controlling the cooling module thereof.

BACKGROUND

Portable electronic devices may provide a diversity of functions. For example, a single such device may provide an imaging function, a music playback function, a navigation function, a short-range wireless communication (for example, Bluetooth, Wi-Fi, or near-field communication "NFC"), biometric security (such as fingerprint recognition) function, an electronic payment function, a virtual reality (VR) and/or augmented reality (AR) function.

Furthermore, as portable electronic devices have advanced, they have become increasingly compact and light to such an extent that some may be worn by a user with negligible inconvenience. For example, wearable electronic devices now include head mounting device (HMD), a smart watch (or smart wristbands), eyeglass-type devices, a contact lens-type device, a ring-type device, a glove-type device, a shoe-type devices, and/or a smart garment-type device. These wearable electronic devices may thus further improve portability and user accessibility. Some wearable electronic devices (hereinafter, referred to as an external electronic device) may be paired with a storage case. (hereinafter, referred to as an electronic device).

SUMMARY

Storage cases may include electronic devices which can receive and charge paired external electronic device, such as wearable electronic devices. That is, the electronic devices (i.e., storage cases) may sometimes include a battery for charging external electronic device (i.e., the wearable device) that is receivable therein. For example, the electronic device may provide a function of storing and/or charging the external electronic device. However, when the external electronic device is disposed in the electronic device, it may often be wholly contained within, which presents problems in effectively discharging heat generated by prior operation of the external electronic device and/or heat generated from the charging process.

Certain embodiments of the disclosure may provide an electronic device including a cooling module (for example, a fan) for increasing cooling of external electronic device stowed within the electronic device, (for example, radiating heat therefrom), and a method for controlling the same. For example, the electronic device may receive information regarding operating state and/or temperature from the external electronic device when the external electronic device is stowed, and may control the cooling module (for example, on/off of the fan, speed of the fan, and/or rotational direction of the fan) based on the received information indicating the operating state and/or temperature.

The technical subjects pursued in the disclosure may not be limited to the above mentioned technical subjects, and other technical subjects which are not mentioned may be clearly understood, through the following descriptions, by those skilled in the art to which the disclosure pertains.

An electronic device according to certain embodiments of the disclosure may include a housing including an inner space for receiving an external electronic device therein, a battery disposed in the housing, a detection module disposed in the housing, and configured to detect one of receiving or removal of the external electronic device from the inner space, at least one cooling module disposed in the housing, at least one processor operatively coupled with the detection module and the at least one cooling module, and a memory operatively coupled with the at least one processor, wherein the memory stores instructions which are executable by the at least one processor to detect, through the detection module, that the external electronic device is received in the housing, receive at least one of an operational state information or temperature information for the external electronic device in response to the detecting of the received external electronic device, and control the at least one cooling module, based on at least one of the operational state information or the temperature information.

A method for controlling at least one cooling module of an electronic device according to certain embodiments of the disclosure may include detecting, using a detection module, that one of receiving or removal of an external electronic device from an inner space defined within a housing of the electronic device, receiving at least one of an operational state information or temperature information for the external electronic device, in response to detecting of the received external electronic device; and controlling an operation of the at least one cooling module, based on at least one of the operational state information or the temperature information.

An electronic device according to certain embodiments of the disclosure may include, a housing, an interface module disposed in the housing and operatively connected to an external device when the electronic device is received in the external device, a communication module, at least one processor operatively coupled with the interface module and the communication module and a memory operatively coupled with the at least one processor, wherein the memory stores instructions which are executable by the at least one processor to detect reception in the external device through the interface module, and based on detecting the reception in the external device, transmit at least one of operational state information or temperature information to the external device through the communication module in response to detecting of the reception in the external device.

An electronic device according to certain embodiments of the disclosure may efficiently control a cooling function based on the state (such as, for example, operating state and/or temperature) of a received external electronic device. Accordingly, the electronic device according to certain embodiments of the disclosure may reduce performance restrictions of the external electronic device caused by heat (such as, for example, restrictions on throttling, charging speed, etc.).

Various other advantageous effects inferable directly or indirectly through this document may be provided.

DETAILED DESCRIPTION

Figure 1:
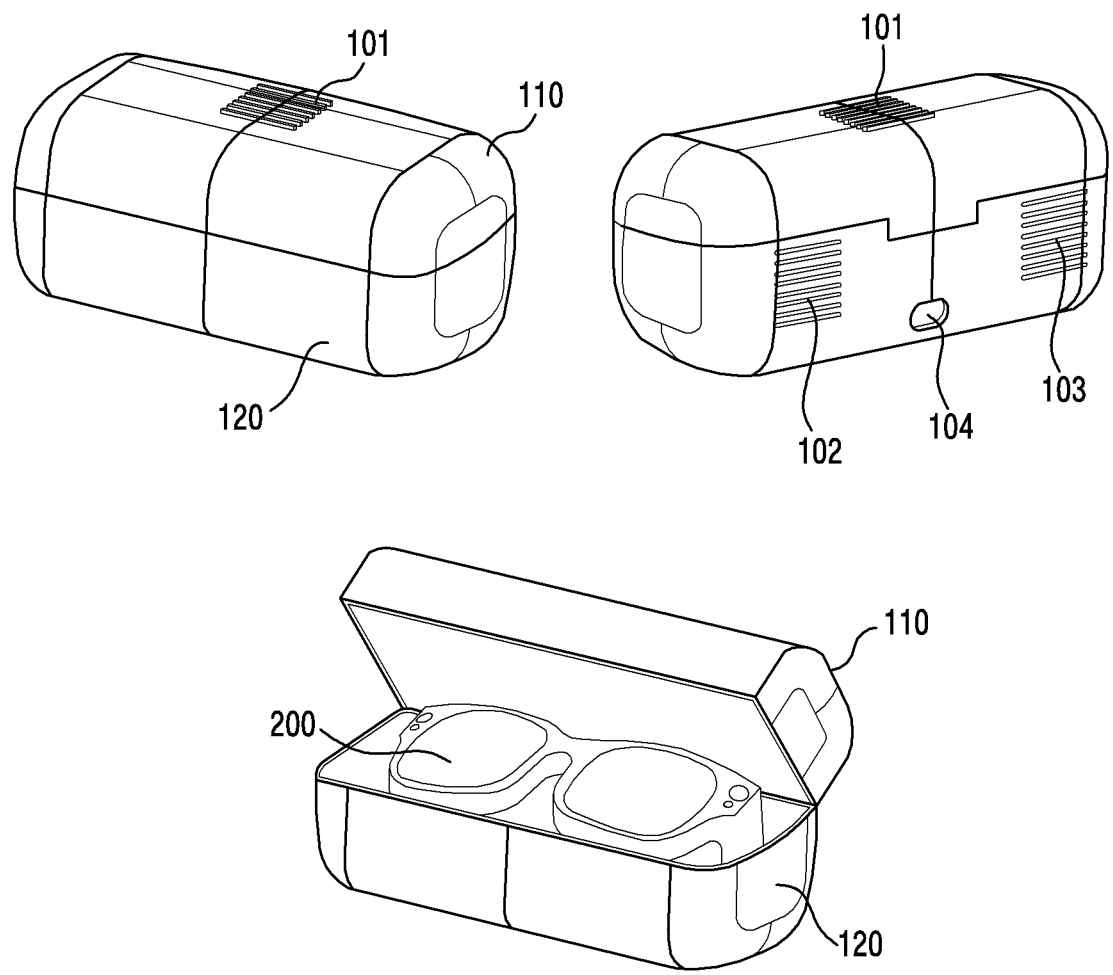
FIG. 1 is a diagram illustrating an example electronic device according to an embodiment of the disclosure.

Hereinafter, certain embodiments of the disclosure will be described with reference to the accompanying drawings. In this document, specified embodiments are illustrated in the drawings and a related detailed description is mentioned, but this is not intended to limit certain embodiments of the disclosure to a specified form. For example, it may be apparent to a person having ordinary skill in the art to which the disclosure pertains that embodiments of the disclosure may be modified diversely.

Figure 2:
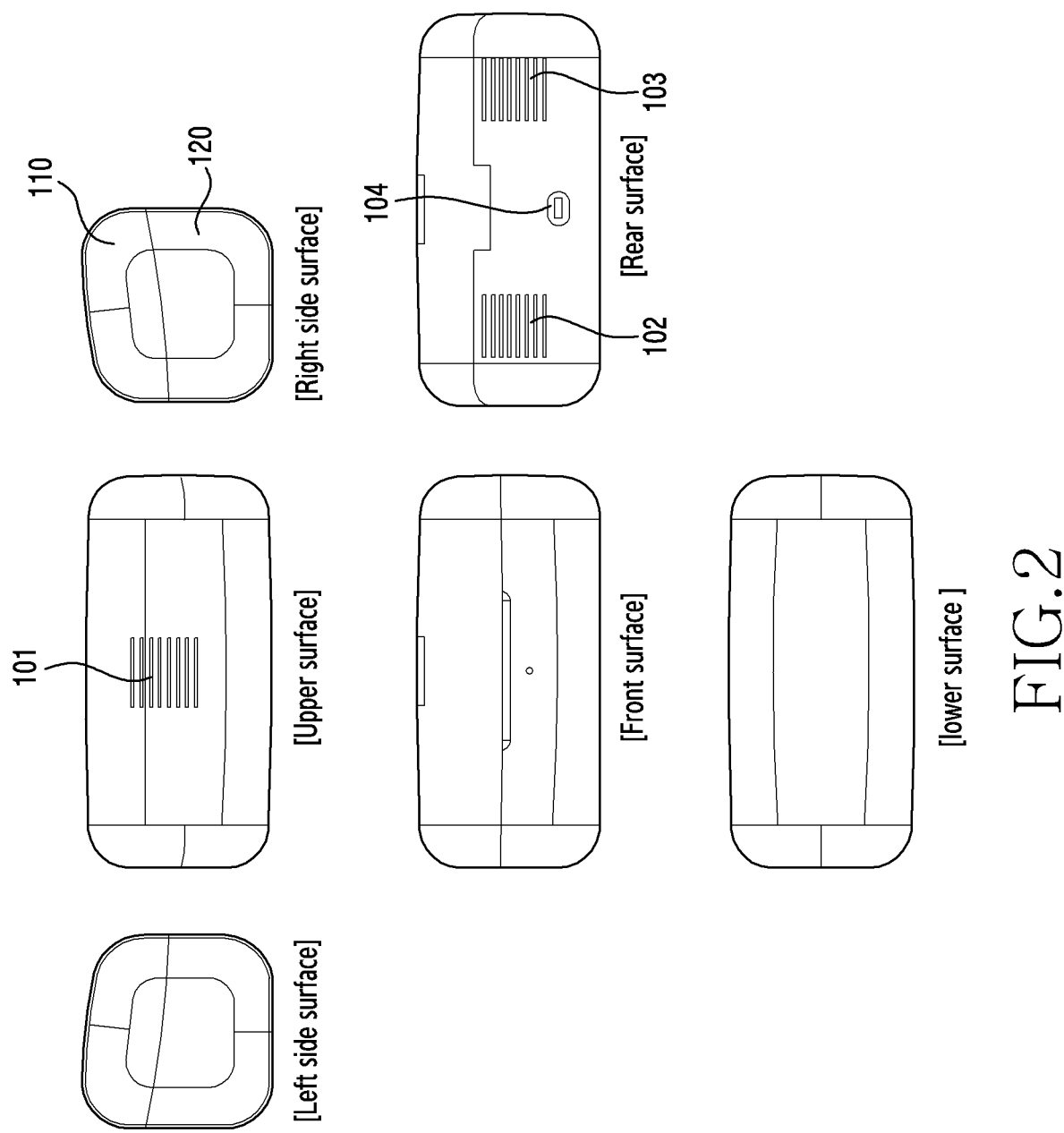
FIG. 2 is a diagram illustrating an example electronic device according to an embodiment of the disclosure.

FIG. 1 and FIG. 2 are diagrams illustrating an electronic device according to an embodiment of the disclosure.

Referring to FIG. 1 and FIG. 2, an electronic device 100 according to an embodiment of the disclosure may have a substantially a cuboid shape, and may include an inner space for accommodating an external electronic device 200. For example, the electronic device 100 may be a case device capable of storing the external electronic device 200 therein.

According to an embodiment, the electronic device 100 may include a first housing 110 and a second housing 120. The first housing 110 and the second housing 120 may be rotatably connected through a hinge module (not illustrated). For example, a user may open the first housing 110, insert the external electronic device 200 into the inner space, and then close the first housing 110.

According to an embodiment, the electronic device 100 may include at least one discharge hole formed in the housing. For example, the electronic device 100 may include a first discharge hole 101 disposed on an upper surface of the first housing 110, and may include a second discharge hole 102 and a third discharge hole 103 arranged on a rear surface of the second housing 120. It is noted this is set forth as an example embodiment, and does not limit the potential embodiments of the disclosure. For example, the electronic device 100 may include two or more discharge holes arranged on the upper surface of the first housing 110. As another example, the electronic device 100 may include one discharge hole or three or more discharge holes arranged on the rear surface of the second housing 120. As yet another example, the electronic device 100 may include the second discharge hole 102 disposed on a right side surface of the second housing 120, and include the third discharge hole 103 disposed on a left side surface of the second housing 120. As yet another example, the electronic device 100 may include the second discharge hole 102 and the third discharge hole 103 arranged on the rear surface of the second housing 120, include a fourth discharge hole (not illustrated) disposed on the right side surface, and include a fifth discharge hole (not illustrated) disposed on the left side surface. Each of the discharge holes may be arranged to correspond to the position of a main heat source (e.g., an application processor, a camera module, a communication module, a charging module, or a display module) of the external electronic device 200 when the external electronic device 200 is stowed.

According to an embodiment, the electronic device 100 may include a cooling device (or a cooling module) (e.g., a fan) disposed at each of the discharge holes. The electronic device 100 may provide a cooling function using the cooling device. For example, the electronic device 100 may activate operation of the cooling device the external electronic device 200 is received, so that the heat of the external electronic device 200 is discharged to an external environment. A detailed description for a method for controlling the cooling device of the electronic device 100 will be described with reference to FIG. 6 to FIG. 8D.

According to an embodiment, the electronic device 100 may include a printed circuit board (not illustrated) on which a communication module (not illustrated), a sensor module (not illustrated), a processor (not illustrated), or a memory (not illustrated) is disposed, a battery (not illustrated), a wired charging port 104 (e.g., a wired charging interface 487 in FIG. 4), and a wireless charging antenna (not illustrated). For example, the printed circuit board (not illustrated), the battery (not illustrated), and/or the wireless charging antenna (not illustrated) may be positioned inside the electronic device 100 (in an area corresponding to a lower surface). In addition, for example, the wired charging port 104 may include a universal serial bus (USB) connector (e.g., a USB type-C connector). A detailed description for each of the elements of the electronic device 100 will be described with reference to FIG. 4.

Figure 3:
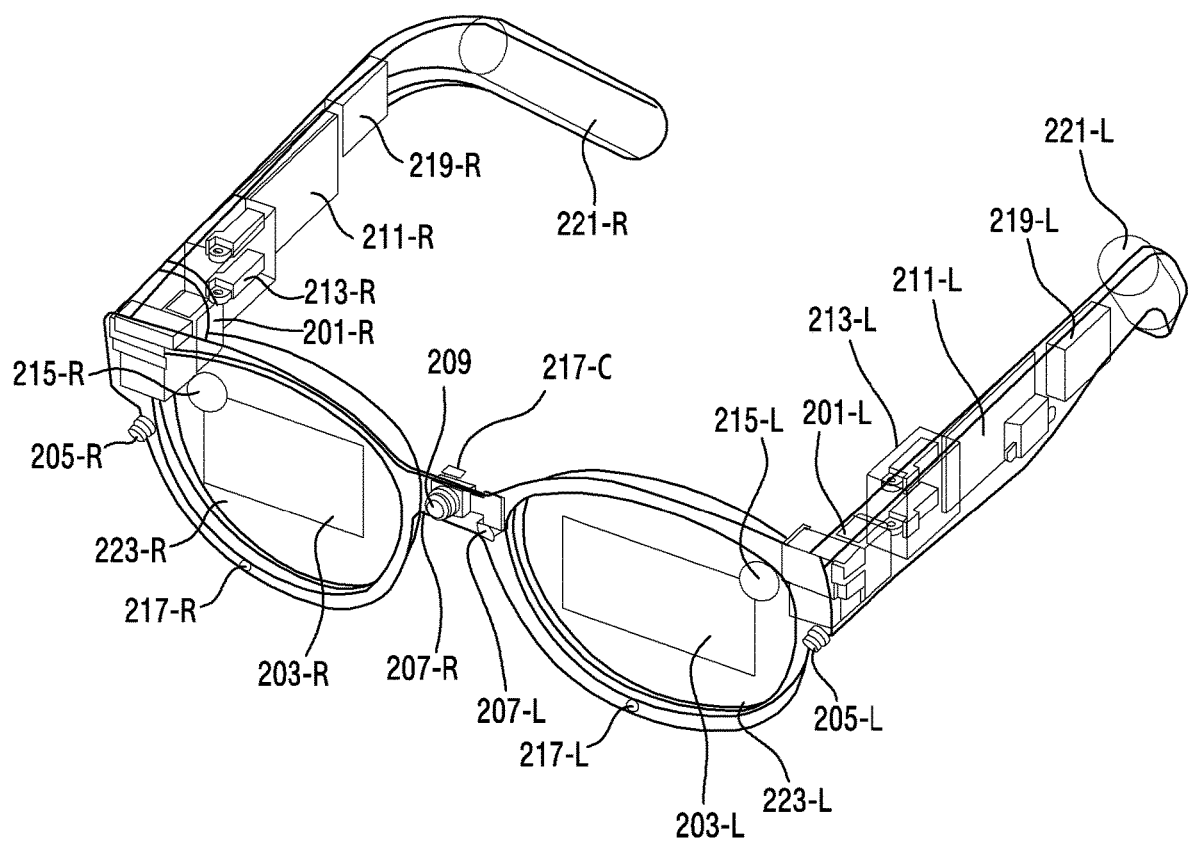
FIG. 3 is a diagram illustrating an example external electronic device according to an embodiment of the disclosure.

FIG. 3 is a diagram illustrating an example external electronic device according to an embodiment of the disclosure.

Referring to FIG. 3, according to an embodiment, the external electronic device 200 may include light output modules 201-L (left) and 201-R (right), optical waveguides 203-L and 203-R, first cameras 205-L and 205-R, second cameras 207-L and 207-R, a third camera 209, printed circuit boards 211-L and 211-R, hinges 213-L and 213-R, optical members 215-L and 215-R, microphones 217-L, 217-R, and 217-C (center), speakers 219-L and 219-R, batteries 221-L and 221-R, and transparent members 223-L and 223-R. The letters "R" and "L" positioned at the end of the reference numerals shown in FIG. 3 may indicate that the corresponding elements are positioned at the right and left sides of the external electronic device, respectively, when the external electronic device is worn. In addition, in FIG. 3, the elements (e.g., the printed circuit boards 211-L and 211-R, the hinges 213-L and 213-R, the speakers 219-L and 219-R, and the batteries 221-L and 221-R) positioned at the glass temples are illustrated to be exposed to an external environment. However, this illustration is merely for convenience of explanation, and the elements are positioned in the glass temples not to be exposed to the outside.

The external electronic device 200 according to an embodiment of the disclosure may be a wearable electronic device. For example, although not limited, the external electronic device 200 may be a glass-type wearable electronic device (e.g., augmented reality (AR) glasses). The glass-type external electronic device 200 may operate while being worn on a user's face. The transparent members 223-L and 223-R may be made of a transparent or translucent glass plate, a plastic plate, or a polymer material so that a user can see the outside even when the external electronic device 200 is worn on the user's face. According to an embodiment, one transparent member 223-R may be disposed to face the user's right eye, and the other transparent member 223-L may be disposed to face the user's left eye.

According to an embodiment, the external electronic device 200 may acquire (capture) an image of the real world through a camera (e.g., the third camera 209), receive, from another electronic device (e.g., a smartphone, a personal computer (PC), a tablet PC, or a server), an augmented reality (AR) object related to an object (e.g., an object or a building) included in the acquired image or the location of the acquired image, and provide (display) the AR object to the user through the light output modules 201-L and 201-R, the optical members 215-L and 215-R, and the optical waveguides 203-L and 203-R. As another example, the external electronic device 200 may receive an audio signal through the microphones 217-L, 217-R, and 217-C, output an audio signal through the speakers 219-L and 219-R, and charge the batteries 221-L and 221-R through charging modules (not illustrated) included in the printed circuit boards 211-L and 211-R.

According to an embodiment, the external electronic device 200 may radiate heat when performing the above operations. For example, the external electronic device 200 may radiate heat from a processor (not illustrated) which performs calculation operations, the first to third cameras 205-L, 205-R, 207-L, 207-R, and 209 which capture an image, the light output modules 201-L and 201-R when activated at a sufficient brightness for a sufficient time, or the batteries 221-L and 221-R and/or charging modules for a case (not illustrated) when current is consumed.

According to an embodiment, the external electronic device 200 may be received in the electronic device 100. For example, the external electronic device 200 may be received in the inner space of the electronic device 100 in a state in which the glass temples are folded for storage, via the hinge modules 213-R and 213-L.

According to an embodiment, the external electronic device 200 may transmit operational state information and/or temperature information to the electronic device 100 when the external electronic device is received in the electronic device 100. According to an embodiment, when the external electronic device 200 includes multiple heat sources, the operational state information may include first operational state information indicating that all the multiple heat sources are operational, second operational state information including information relating to some heat sources which are operational among the multiple heat sources, and third operational information indicating that all the multiple heat sources are not operational. The temperature information may include temperature information of each of the multiple heat sources. According to an embodiment, the external electronic device 200 may transmit, to the electronic device 100, temperature information indicating that a heat source has a temperature exceeding a first designated reference temperature. The first reference temperature may be a minimum temperature (e.g., about 25 degrees) in which cooling is to be activated.

According to an embodiment, the external electronic device 200 may periodically or aperiodically transmit at least one of operational state information or temperature information to the electronic device 100. According to an embodiment, the external electronic device 200 may transmit, to the electronic device 100, temperature information of a heat source having a temperature of the first designated reference temperature (e.g., about 25 degrees) or higher among the multiple heat sources.

According to an embodiment, the external electronic device 200 may transmit information on a battery level (i.e., a charge level of the battery) to the electronic device 100. According to an embodiment, the external electronic device 200 may transmit information on a battery level of a battery (e.g., a battery 590 in FIG. 5) to the electronic device 100 when the battery level is lower than a designated reference value (e.g., about 10% charge). When a battery level of the external electronic device 200 is lower than the designated reference value, the electronic device 100 may terminate the operation of the cooling device, and charge the battery of the external electronic device 200. According to another embodiment, when a battery level of the battery (e.g., a battery 590 in FIG. 5) of the external electronic device 200 is lower than a designated reference value (e.g., about 10%), and a battery level of a battery (e.g., a battery 490 in FIG. 4) of the electronic device 100 is lower than even a second designated reference value (e.g., about 30%), the operation of a cooling device is stopped, and a charging operation of the external electronic device 200 and the electronic device 100 may be performed. For example, the electronic device 100 may provide a notification indicating that battery charging is required. For example, the notification indicating that battery charging is required may be provided through a speaker (not illustrated) (e.g., a sound), a light emitting element (not illustrated) (e.g., an LED), or a display (not illustrated) (e.g., text) of the electronic device 100.

Figure 4:
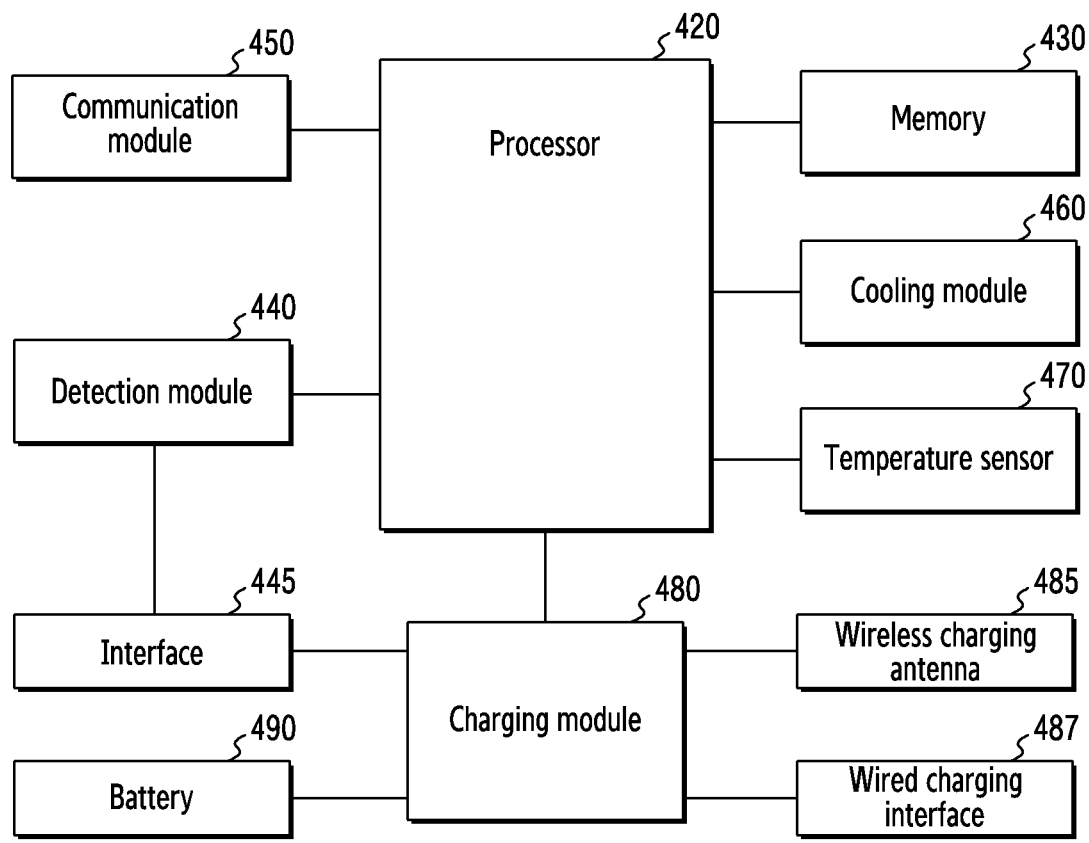
FIG. 4 is a block diagram of an example electronic device according to an embodiment of the disclosure.

According to an embodiment, the electronic device 100 may receive power supplied from an external, by using a wired charging interface (e.g., a wired charging interface 487 in FIG. 4) and/or a wireless charging antenna (e.g., a wireless charging antenna 485 in FIG. 4). The electronic device 100 may charge a battery (e.g., the battery 590 in FIG. 5) of the external electronic device 200 and/or a battery (e.g., the battery 490 in FIG. 4) of the electronic device 100 by using the power supplied from the outside. For example, the electronic device 100 may charge the battery of the electronic device 100 by using power supplied through the wired charging interface and/or the wireless charging antenna, and may transmit the power of the battery of the electronic device 100 to the external electronic device 200 through interfaces (e.g., an interface 445 in FIG. 4 and an interface 580 in FIG. 5) for connection between the electronic device 100 and the external electronic device 200 so as to enable the battery of the external electronic device 200 to be charged. According to certain embodiments, a scheme of charging the battery of the external electronic device 200 is not limited thereto. For example, the electronic device 100 may transmit, to the external electronic device 200, at least part of the power supplied from the wired charging interface of the electronic device 100, through the interfaces (e.g., the interface 445 in FIG. 4 and the interface 580 in FIG. 5), so as to enable the battery 590 of the external electronic device 200 to be charged. According to another embodiment, the electronic device 100 may restart the operation of the cooling device when the battery 590 (battery level) of the external electronic device 200 shows a designated reference value (e.g., about 10%) or higher, and the battery 490 (battery level) of the electronic device 100 shows another designated reference value (e.g., about 30%) or higher. For example, when, by using the power supplied from the outside, the battery level of the external electronic device 200 becomes a designated reference value (e.g., about 10%) or higher, and the battery level of the electronic device 100 becomes a designated reference value (e.g., about 30%) or higher, the heat generated when the external electronic device 200 is charged, or the heat of the external electronic device 200 which is generated before the reception can be effectively discharged by operating the cooling device of the electronic device 100.

According to another embodiment, the electronic device 100 may restart the operation of the cooling device when the battery 590 (battery level) of the external electronic device 200 shows a designated reference value (e.g., about 10%) or higher. For example, when, by using the power supplied from the outside, the battery level of the external electronic device 200 becomes a designated reference value (e.g., about 10%) or higher, the heat generated when the external electronic device 200 is charged, or the heat of the external electronic device 200 which is generated before the reception can be effectively discharged by operating the cooling device of the electronic device 100.

FIG. 4 is a block diagram of an electronic device 400 according to an embodiment of the disclosure.

Referring to FIG. 4, the electronic device 400 (e.g., the electronic device 100 in FIG. 1 and FIG. 2) according to an embodiment of the disclosure may include a processor 420, a memory 430, a detection module 440, an interface 445, a communication module 450, a cooling module 460 (e.g., a cooling device), a temperature sensor 470, a charging module 480, a wireless charging antenna 485, a wired charging interface 487, and a battery 490.

According to an embodiment, the processor 420 may control the cooling module 460 to cool an external electronic device (e.g., the external electronic device 200 in FIG. 3) when the external electronic device is stowed. According to an embodiment, the processor 420 may control the cooling module 460, based on at least one of an operational state or the temperature of the external electronic device 200. For example, the processor 420 may control at least one of an on/off operation, a rotation speed, or a rotation direction of the cooling module 460. According to an embodiment, the processor 420 may control (e.g., an operation setting a designated speed and a designated time interval) an initial operation of at least some cooling modules (e.g., cooling modules corresponding to heat sources in operation), based on the operational state, and then control the cooling modules according to temperature information of each of the heat sources. A detailed description therefor will be described with reference to FIG. 6 to FIG. 8D.

According to an embodiment, the memory 430 may be operatively coupled with the processor 420. The memory 430 may store instructions which, when executed, cause the processor 420 to control the cooling module 460, based on at least one of an operational state or the temperature of the external electronic device 200 when the external electronic device is received in the electronic device 400.

According to an embodiment, the memory 430 may store a control table (hereinafter, a first control table) for controlling the cooling module 460 according to the operational state of the external electronic device 200. For example, the memory 430 may store the first control table which is <Table 1> below.

TABLE 1

| Operational state | Rotation Speed (rpm) | Cooling Module | Operation Time |
|---|---|---|---|
| First Operational state (All heating resources operated) | 2500 | All | One minute |
| Second Operational state (Some heating resources operated) | 2500 | Some | One minute |
| Third Operational state (No heating resources operated) | 2500 | All | 30 seconds |

Referring to the first control table, the electronic device 400 may operate all cooling modules 460 at 2500 rpm for one minute when the external electronic device 200 is in a first operational state, operate some (e.g., limiting activation to cooling modules that are proximate the actual heat sources in operation) of the cooling modules 460 at 2500 rpm for one minute when the external electronic device 200 is in a second operational state, and operate all cooling modules 460 at 2500 rpm for 30 seconds when the external electronic device 200 is in a third operational state. There may be residual heat lingering due to previous operations, even in the third operational state where the heat sources of the external electronic device 200 are inoperative, and thus the electronic device 400 may operate all the cooling modules 460 for a relatively short time (e.g., 30 seconds).

According to an embodiment, the memory 430 may store a control table (hereinafter, a second control table) for controlling the cooling module 460 according to a temperature level. For example, the memory 430 may store the second control table which is shown by way of example in <Table 2> below.

TABLE 2

| Temperature Level (° C.) | Rotation Speed (rpm) | Note |
|---|---|---|
| 25-30 degrees | 500 | No Noise |
| 30-34 degrees | 1000 | Low Noise |
| 34-38 degrees | 1500 | Intermediate Noise |
| 38-42 degrees | 2000 | High Noise |
| 42-45 degrees | 2500 | High Noise |

According to an embodiment, the second control table may be used after the initial operation of the cooling modules 460, based on the operational state of the external electronic device 200. For example, after the initial operation of the cooling modules 460, the cooling modules 460 corresponding to heat sources may be individually controlled based on temperature information of each of the heat sources and the second control table.

According to an embodiment, the detection module 440 may detect the reception of the external electronic device 200. According to an embodiment, the detection module 440 may include at least one of a hall integrated circuit (IC), a magnetic sensor, or a contact sensor, the sensing value of which may change when the external electronic device 200 is received in the electronic device 400.

According to an embodiment, the interface 445 may include a connector which can be physically connected to the external electronic device 200. For example, the interface 445 may include multiple contact terminals (e.g., a pogo pin). Some of the multiple contact terminals may be connected to the detection module 440 to detect the reception of the external electronic device 200, and some of the contact terminals may be connected to the charging module 480 to charge the battery of the external electronic device 200. According to an embodiment, the interface 445 may further include a contact terminal configured for wired communication with the external electronic device.

According to an embodiment, the communication module 450 may communicate with the external electronic device 200. For example, although not limited, the communication module 450 may include a Bluetooth module or a near field communication (NFC) module. The communication module 450 may receive at least one of operational state information or temperature information from the external electronic device 200. The communication module 450 may receive battery level information from the external electronic device 200. For example, the communication module 450 may receive the battery level information from the external electronic device 200 when the external electronic device is received in the electronic device 400.

According to an embodiment, the cooling module 460 may perform a cooling function for the external electronic device 200 received in a housing (e.g., the first housing 110 and the second housing 120 in FIG. 1 and FIG. 2). According to an embodiment, the cooling module 460 may be positioned at least one of an upper surface, a front surface, a rear surface, a left side surface, or a right side surface of the housing. For example, the cooling module 460 may be positioned to correspond to the heat source of the external electronic device 200 received in the housing. The cooling module 460, although not limited, may include at least one fan which can rotate in the clockwise direction or the counterclockwise direction. An on/off operation, a cooling speed (the rotation speed of the fan), or a cooling direction (the rotation direction of the fan) of the cooling module 460 according to an embodiment may be controlled based on the operational state or the temperature of the external electronic device 200.

According to an embodiment, the temperature sensor 470 may be positioned around the cooling module 460 to measure temperature. For example, the temperature sensor 470 may be activated at the time of sensing the reception of the external electronic device 200 in the electronic device 400, measure temperature, and transfer the measured temperature to the processor 420. According to an embodiment, the temperature sensor 470 may be activated in a case where temperature information is unable to be received from the external electronic device 200. According to another embodiment, in a case where the electronic device 400 controls the cooling module 460 to use temperature information received from the external electronic device 200, the temperature sensor 470 may not be included in the electronic device 400.

According to an embodiment, the charging module 480 may charge the battery 490 when another electronic device (e.g., a charging device) is connected to the electronic device 400. For example, the charging module 480 may charge the battery 490 using the power received through the wireless charging antenna 485 and/or the power supplied through the wired charging interface 487.

According to an embodiment, the wireless charging antenna 485 may wirelessly receive power from another device (e.g., a wireless charging device).

According to an embodiment, the wired charging interface 487 may include an interface which is connected to another electronic device (e.g., a charging device) to enable charging of the battery 490 and/or the battery (e.g., the battery 590 in FIG. 5) of the external electronic device 200. For example, the wired charging interface 487 may include a universal serial bus (USB) interface. According to another embodiment, the wired charging interface 487 may support one or more designated protocols which can be used for wired connection to the external electronic device 200. For example, a protruding connector (e.g., a micro 5-pin connector, a type-C dock connector, or a 8-pin connector) for physical connection to the external electronic device 200 may be included.

According to an embodiment, the battery 490 may supply power to at least one element of the electronic device 400. The battery 490 may include, for example, a rechargeable secondary battery or a fuel battery.

According to certain embodiments of the disclosure, an electronic device (e.g., the electronic device 100 in FIG. 1 and FIG. 2 or the electronic device 400 in FIG. 4) may include: a housing (e.g., the first housing 110 and the second housing 120 in FIG. 1) including an inner space for reception of an external electronic device (e.g., the external electronic device 200 in FIG. 3 or the external electronic device 500 in FIG. 5); a battery (e.g., the battery 490 in FIG. 4) disposed in the housing; a detection module (e.g., the detection module 440 in FIG. 4) disposed in the housing and configured to sense whether the external electronic device 200 is received; at least one cooling module (e.g., the cooling module 460 in FIG. 4) disposed in the housing; at least one processor (e.g., the processor 420 in FIG. 4) operatively coupled with the detection module 440 and the at least one cooling module; and a memory (e.g., the memory 430 in FIG. 4) operatively coupled with the at least one processor 420, such that the memory 430 stores instructions which, when executed, cause the at least one processor 420 to sense, through the detection module, that the external electronic device 200 is received in the housing, acquire at least one of operational state information or temperature information of the external electronic device 200 in response to the sensing of the reception, and control the at least one cooling module 460, based on at least one of the operational state information or the temperature information.

According to certain embodiments, the operational state information may include first operational state information indicating that all multiple heat sources included in the external electronic device 200 are operating, second operational state information including information relating to some heat sources which are operating among the multiple heat sources, and third operational state information indicating that all the multiple heat sources are not operating.

According to certain embodiments, the electronic device may include, as the at least one cooling module 460, multiple cooling modules, and the processor 420 may operate all or some of the multiple cooling modules, based on the operational state information.

According to certain embodiments, the temperature information may include temperature information of each of multiple heat sources included in the external electronic device. The processor 420 may control the at least one cooling module 460, based on the temperature information of each of the heat sources.

According to certain embodiments, the electronic device may further include at least one temperature sensor (e.g., the temperature sensor 470 in FIG. 4) disposed around the at least one cooling module. The processor 420 may receive the temperature information from the external electronic device, or acquire the temperature information by using the at least one temperature sensor.

According to certain embodiments, the processor 420 may measure temperature of each cooling module 460 through the at least one temperature sensor 470 and, based on a result of the measurement, stop a cooling module 460 corresponding to a heat source having a temperature lower than a second designated reference temperature, or control a cooling direction of the corresponding cooling module 460 to form an air flow for another heat source having the second reference temperature or higher.

According to certain embodiments, the at least one cooling module 460 may be disposed in the housing to correspond to a heat source of the external electronic device 200 when the external electronic device 200 is received.

According to certain embodiments, the processor 420 may check whether the battery 490 shows a first designated reference level or higher, and if the battery shows the first reference level or higher, control the cooling module 460. If the battery 490 shows a level lower than the first reference level, a battery level of the external electronic device 200 may be identified, and if the battery level of the external electronic device 200 is lower than a second designated reference level, the at least one cooling module 460 may be deactivated.

Figure 5:
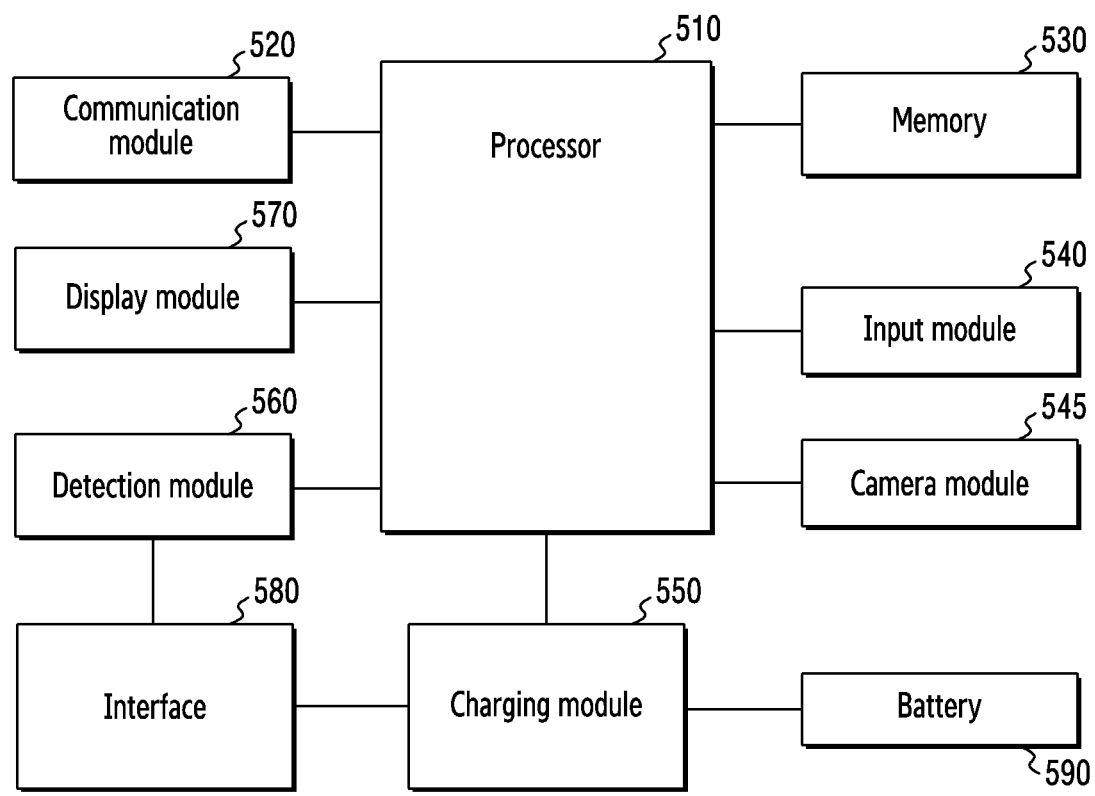
FIG. 5 is a block diagram of an example external electronic device according to an embodiment of the disclosure.

FIG. 5 is a block diagram of an external electronic device 500 according to an embodiment of the disclosure.

Referring to FIG. 5, an external electronic device (e.g., the external electronic device 200) according to an embodiment of the disclosure may include a processor 510, a communication module 520, a memory 530, an input module 540, a camera module 545, a charging module 550, a detection module 560, a display module 570, an interface 580, and a battery 590.

According to an embodiment, the processor 510 may control at least one element of an external electronic device 500 (e.g., the external electronic device 200 in FIG. 3), and perform various data processing or calculating operations. The processor 510 according to an embodiment may transmit at least one of operational state information or temperature information of heat sources to an electronic device (e.g., the electronic device 100 in FIG. 1 and FIG. 2, or the electronic device 400 in FIG. 4) through the communication module 520 at the time of reception in the electronic device. The operational state information may include a first operational state indicating that all multiple heat sources are operational, second operational state information including information indicating that some heat sources which are operational among the multiple heat sources, and third operational state information indicating that the multiple heat sources are not operational. The temperature information may include temperature information of each of the multiple heat sources. According to an embodiment, the external electronic device 500 may further include temperature sensors (not illustrated) disposed proximate to the heat sources of the external electronic device 500. For example, the external electronic device 500 may acquire temperature information of each of the multiple heat sources in the first operational state to the third operational state by using the temperature sensors (not illustrated). For example, the temperature sensors (not illustrated) may measure the temperature of corresponding heat sources (e.g., a heat source in operation), based on the operational state (e.g., the first operational state to the third operational state) of the external electronic device 500. As another example, the temperature sensors (not illustrated) may periodically or aperiodically measure the temperature of the heat sources.

According to an embodiment, the processor 510 may identify and/or store information (e.g., temperature change amount information) related to a temperature change amount of the heat sources of the external electronic device 500, and transfer the temperature change amount information to the electronic device (e.g., the electronic device 100 in FIG. 1 and FIG. 2, or the electronic device 400 in FIG. 4) by using the communication module 520 at the time of reception in the electronic device (e.g., the electronic device 100 or 400). For example, temperature information for the heat sources, as acquired through the temperature sensors (not illustrated) of the external electronic device 500, may be stored in the memory 530, and the temperature change amount of each of the heat sources may thus be identified. For example, the external electronic device 500 may identify a temperature change amount in the camera module 545 over a designated time period (e.g., ten minutes), and determine whether the temperature change amount of the camera module 545 is equal to or larger than a predesignated change amount or threshold (e.g., about 5 degrees). If the temperature change amount is equal to or larger than the designated change amount, the external electronic device 500 may transmit the temperature change amount information to the electronic device (e.g., the electronic device 100 in FIG. 1 and FIG. 2, or the electronic device 400 in FIG. 4) using the communication module 520 when the external electronic device 500 is stowed in the electronic device (e.g., the electronic device 100 or 400). According to an embodiment, the electronic device 400 may perform a cooling function using a high rotation speed (e.g., 2000 rpm) for a heat source indicating the predesignated change amount or higher, as triggered by the received temperature change amount information. For example, if a temperature level (range) of a heat source (e.g., the camera module 545), as identified by the external electronic device 500, is 34-38 degrees, and the temperature of the heat source changes by the predesignated change amount (e.g., about 5 degrees) or higher within a designated time (e.g., 10 minutes), the electronic device (e.g., the electronic device 100 in FIG. 1 and FIG. 2, or the electronic device 400 in FIG. 4) may operate a cooling module (e.g., the cooling module 460 in FIG. 4) at a high rotational speed (e.g., 2000 rpm) rather than 1500 rpm in the second control table (e.g., <Table 2>).

According to an embodiment, the communication module 520 may communicate with the electronic device. For example, although not limited, the communication module 520 may include a Bluetooth module or a near field communication (NFC) module. The communication module 520 may transmit at least one of operational state information or temperature information to the electronic device under a control of the processor 510 when the external electronic device is stowed in the electronic device. The communication module 520 may transmit battery level information to the electronic device.

According to an embodiment, the memory 530 may be operatively coupled with the processor 510. The memory 530 may store instructions which, when executed, the processor 510 to interwork with the electronic device to perform the cooling function. The memory 530 may include a volatile memory or a non-volatile memory.

According to an embodiment, the input module 540 may receive a command or data to be used for an element (e.g., the processor 510) of the external electronic device 500 as externally generated (e.g., from a user) via the external electronic device 500. The input module 540 may include, for example, a microphone, a key (e.g., a button), or a camera module (e.g., gesture recognition).

According to an embodiment, the camera module 545 may capture an image of a subject. According to an embodiment, the camera module 545 may include one or more lenses, image sensors, image signal processors, or flashes. The camera module 545 may include a first camera (e.g., the first cameras 205-L and 205-R in FIG. 3) configured to recognize (e.g., head tracking, hand detection and tracking, spatial recognition, or gesture recognition) the motion of a moving object, a second camera (e.g., the second cameras 207-L and 207-R in FIG. 3) configured to track a user's eyes, and a third camera (e.g., the third camera 209 in FIG. 3) configured to capture an image.

According to an embodiment, the charging module 550 may charge the battery 590 by using the power supplied from the electronic device or another electronic device (e.g., a charging device).

According to an embodiment, the detection module 560 may detect that the external electronic device is received in the electronic device. For example, the detection module 560 may include at least one of a hall IC, a magnetic sensor, or a contact sensor.

According to an embodiment, the interface 580 may include a connector which can be physically connected to the electronic device. For example, the interface 580 may include multiple contact terminals (e.g., a pogo pin). Some of the multiple contact terminals may be connected to the detection module 560 to sense reception in the electronic device, and some of the contact terminals may be connected to the charging module 550 so as to be used to receive power from the electronic device and charge the battery 590. According to an embodiment, the interface 580 may further include at least one contact terminal for wired communication with the electronic device.

According to an embodiment, the battery 590 may supply power to at least one element of the external electronic device 500. The battery 590 may include, for example, a rechargeable secondary battery or a fuel battery.

According to an embodiment, the display module 570 may visually provide information to the outside (e.g., a user) of the external electronic device 500 (e.g., to a user). For example, the display module 570 may include a light output module (e.g., the light output modules 201-R and 201-L in FIG. 3) and an optical waveguide (e.g., the optical waveguides 203-R and 203-L in FIG. 3).

According to an embodiment, the display module 570 may provide an image to a user. For example, the light output module (e.g., the light output modules 201-R and 201-L in FIG. 3) may include a display panel (not illustrated) capable of outputting an image, and an optical member (e.g., the optical members 215-L and 215-R in FIG. 3) which corresponds to a user's eyes and is configured to guide the image to a transparent member (e.g., the transparent members 223-L and 223-R in FIG. 3). For example, a user may acquire an image output from the display panel (not illustrated), through the light output module (e.g., the light output modules 201-R and 201-L in FIG. 3) and the optical member (e.g., the optical members 215-L and 215-R in FIG. 3). For example, the light output module (e.g., the light output modules 201-R and 201-L in FIG. 3) may include a liquid crystal display (LCD), a digital mirror device (DMD), a liquid crystal on silicon (LCoS), an organic light emitting diode (OLED), or a micro light emitting diode (micro LED).

According to an embodiment, the optical waveguides 203-R and 203-L may transfer light generated in the light output modules 201-R and 201-L to a user's eyes. The optical waveguide may be manufactured of glass, plastic, or polymer, and include a nano pattern disposed on one inner or outer surface thereof, for example, a polygonal or curved grating structure. According to an embodiment, light incident into one end of the optical waveguide may be provided to a user by being propagated inside the optical waveguide by the nano pattern. According to another embodiment, the optical waveguide configured by a free-form prism may provide incident light to a user through a reflective mirror.

According to an embodiment, the optical waveguides 203-R and 203-L may include at least one of at least one diffractive element (e.g., a diffractive optical element (DOE) or a holographic optical element (HOE)) or a reflective element (e.g., a reflective mirror). The optical waveguide may induce light emitted from the light output module to a user's eye by using at least one diffractive element or a reflective element. The diffractive element may include an input optical member (e.g., the optical members 215-R and 215-L) and an output optical member (not illustrated), and the reflective element may include a total internal reflection (TIR). For example, light emitted from the light output module may be induced to the optical waveguide through the input optical member, and light having moved through the inside of the optical waveguide may be induced in the direction toward a user's eye through the output optical member (not illustrated). A user can see an image through the light induced in the direction of their eye.

According to an embodiment, the external electronic device 500 may not include the optical waveguide. For example, the external electronic device 500 may not include the optical waveguide in a case where a transparent display (not illustrated) is oriented to face the user's eyes.

According to an embodiment, the external electronic device 500 may further include at least one of a microphone, a speaker, an antenna, or a sensor module.

According to certain embodiments of the disclosure, an electronic device (e.g., the external electronic device 200 in FIG. 3 or the external electronic device 500 in FIG. 5) may include: a housing; an interface module (e.g., the interface 580 in FIG. 5) which is disposed in the housing and is configured to be connected to an external device (e.g., the electronic device 100 in FIG. 1 and FIG. 2 or the electronic device 400 in FIG. 4) at a time of reception in the external device; a communication module (e.g., the communication module 520 in FIG. 5); at least one processor (e.g., the processor 510 in FIG. 5) operatively coupled with the interface module and the communication module; and a memory (e.g., the memory 530 in FIG. 5) operatively coupled with the at least one processor, such that the memory stores instructions which, when executed, cause the at least one processor to sense reception in the external device through the interface module, and transmit at least one of operational state information or temperature information to the external device through the communication module in response to the sensing of the reception.

According to certain embodiments, the processor may periodically transmit at least one of an operational state or the temperature information to the external device through the communication module.

According to certain embodiments, the electronic device may further include a battery. The processor may transmit information on a level of the battery to the external device when the level of the battery is lower than a designated reference value.

According to certain embodiments, the temperature information may include temperature information of each of multiple heat sources. The operational state information may include first operational state information indicating that all the multiple heat sources are operating, second operational state information including information relating to some heat sources which are operating among the multiple heat sources, and third operational state information indicating that all the multiple heat sources are not operating.

Figure 6:
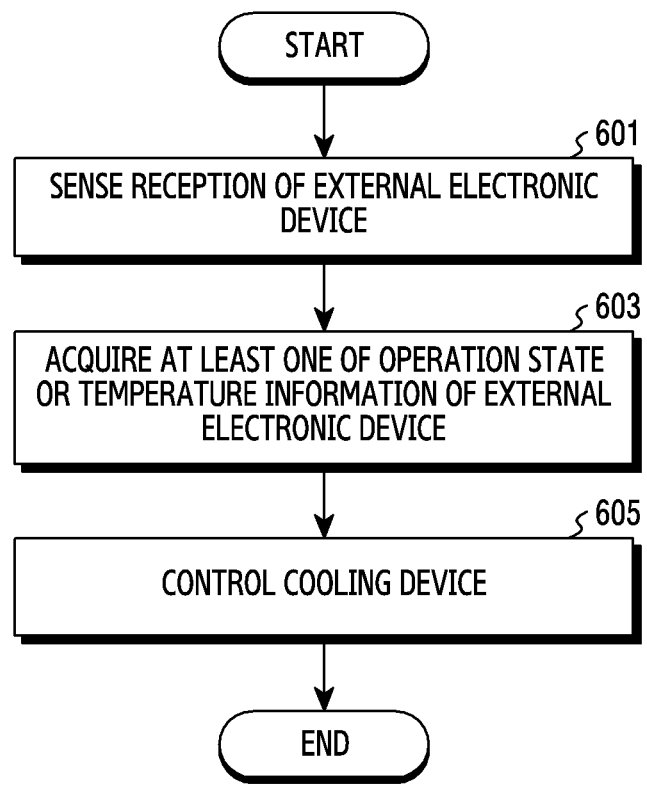
FIG. 6 is a flow chart illustrating a method for controlling a cooling module of an electronic device according to an example embodiment of the disclosure.

FIG. 6 is a flow chart illustrating a method for controlling a cooling module of an electronic device according to an embodiment of the disclosure.

Referring to FIG. 6, a processor (e.g., the processor 420 in FIG. 4) of an electronic device (e.g., the electronic device 100 or 400) according to an embodiment of the disclosure may sense reception of an external electronic device (e.g., the external electronic device 200 or 500) in an operation 601. For example, the processor may sense reception of the external electronic device through a detection module (e.g., the detection module 440).

According to an embodiment, the processor 420 may acquire at least one of operational state information or temperature information of the external electronic device 200 in operation 603. For example, the processor 420 may receive at least one of operational state information or temperature information from the external electronic device 200 through a communication module (e.g., the communication module 450). According to an embodiment, the processor 420 may receive operational state information from the external electronic device, and measure temperature by using a temperature sensor (e.g., the temperature sensor 470). According to another embodiment, the processor 420 may receive operational state information and temperature information (e.g., temperature information and/or temperature change amount information) from the external electronic device 200. For example, the processor 420 may identify the temperature of a heat source of the external electronic device 200 by using temperature information acquired from the external electronic device 200 and/or temperature obtained by using the temperature sensor (e.g., the temperature sensor 470). For example, an intermediate value between the temperature information and the temperature obtained by using the temperature sensor (e.g., the temperature sensor 470) may be identified as the temperature of the heat source of the external electronic device.

According to an embodiment, the processor 420 may control a cooling device (e.g., the cooling module 460) in an operation 605. For example, the processor 420 may control settings and operations of the cooling device (e.g., activation/deactivation, a fan speed, or an air flow direction), based on the acquired at least one of the operational state information or the temperature information. A detailed description for a method for controlling the cooling device will be described with reference to FIG. 7 to FIG. 8D.

Figure 7:
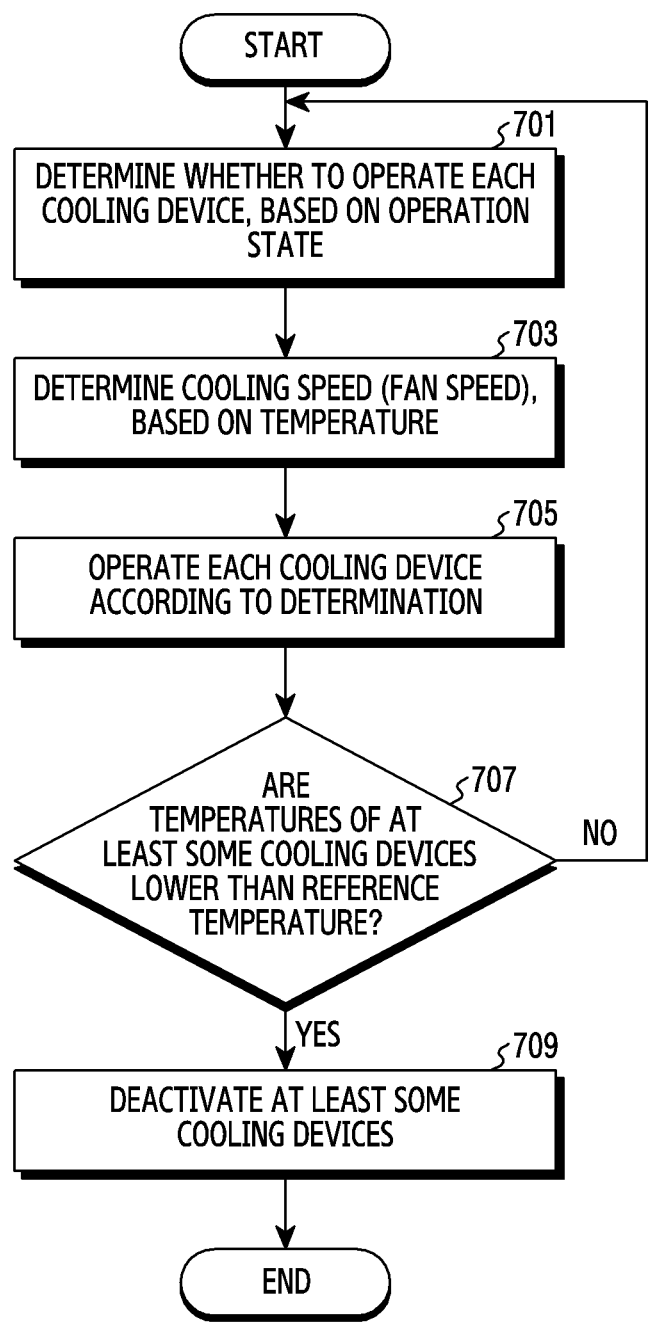
FIG. 7 is a flow chart illustrating a control operation of a cooling module of an electronic device according to an example embodiment of the disclosure.
Figure 8A:
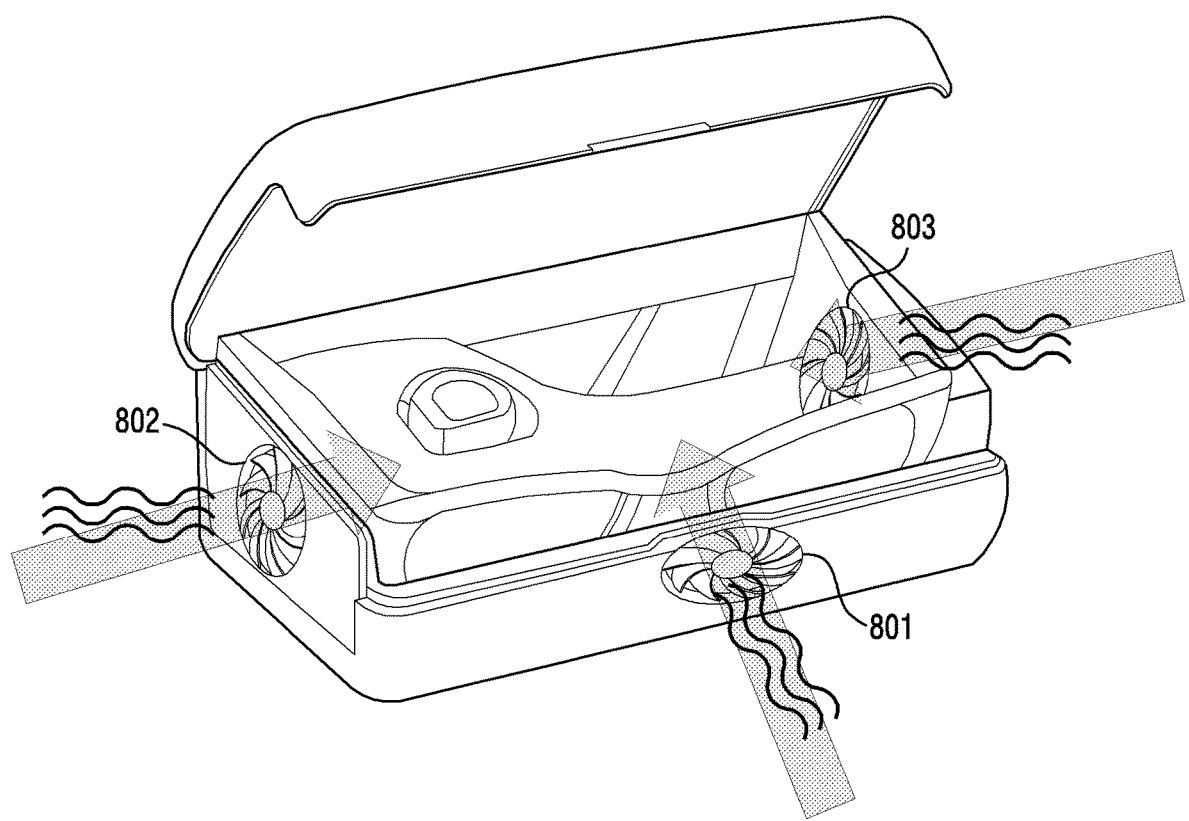
FIG. 8A is a diagram illustrating an example in which all multiple cooling modules of an electronic device operate according to an example embodiment of the disclosure.
Figure 8B:
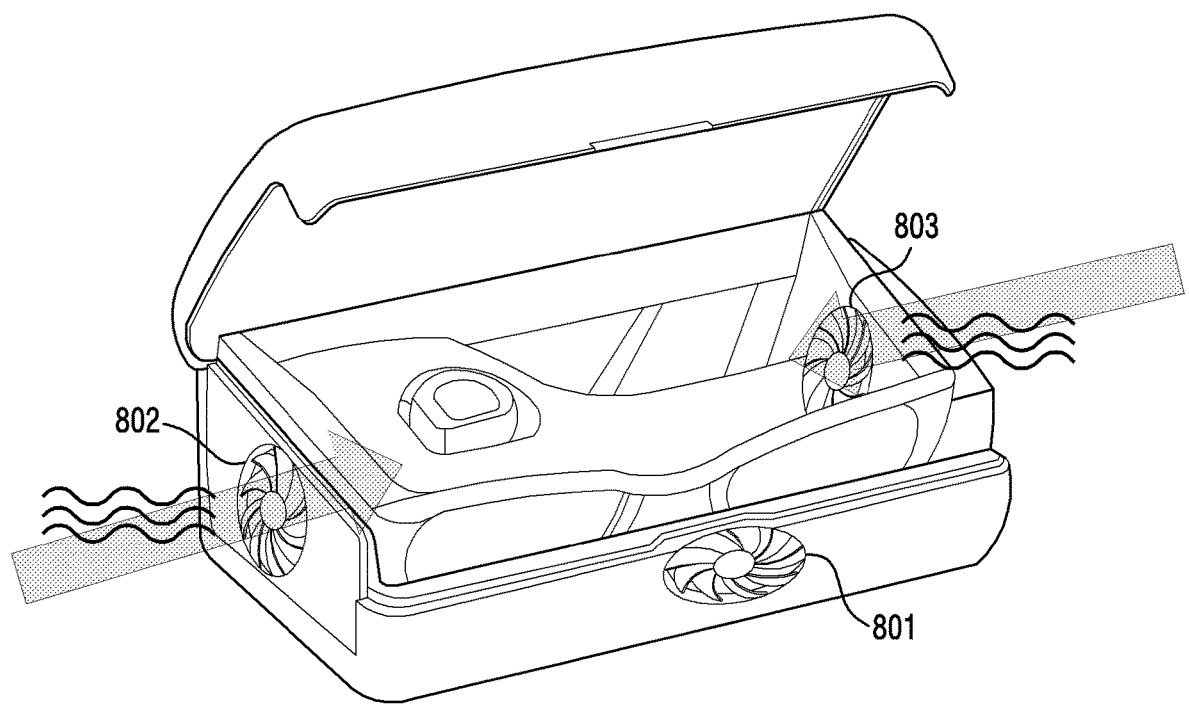
FIG. 8B is a diagram illustrating an example in which some of multiple cooling modules of an electronic device operate according to an example embodiment of the disclosure.
Figure 8C:
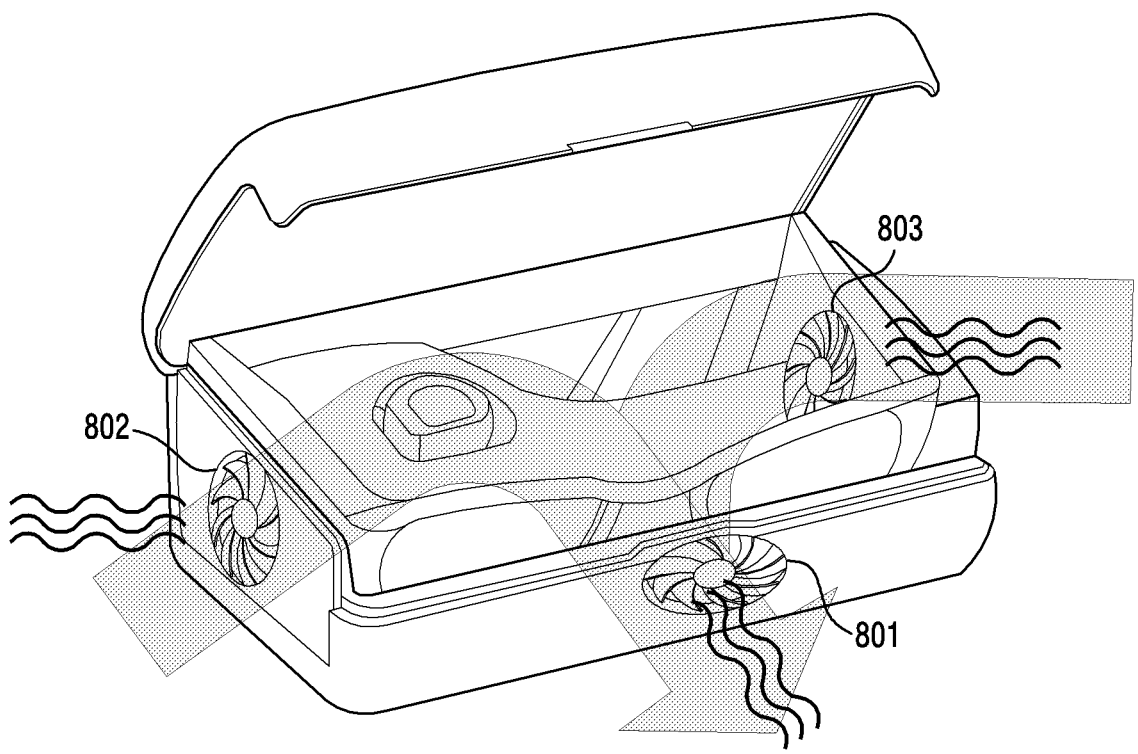
FIG. 8C is a diagram illustrating an example in which an electronic device forms an air flow according to an example embodiment of the disclosure.
Figure 8D:
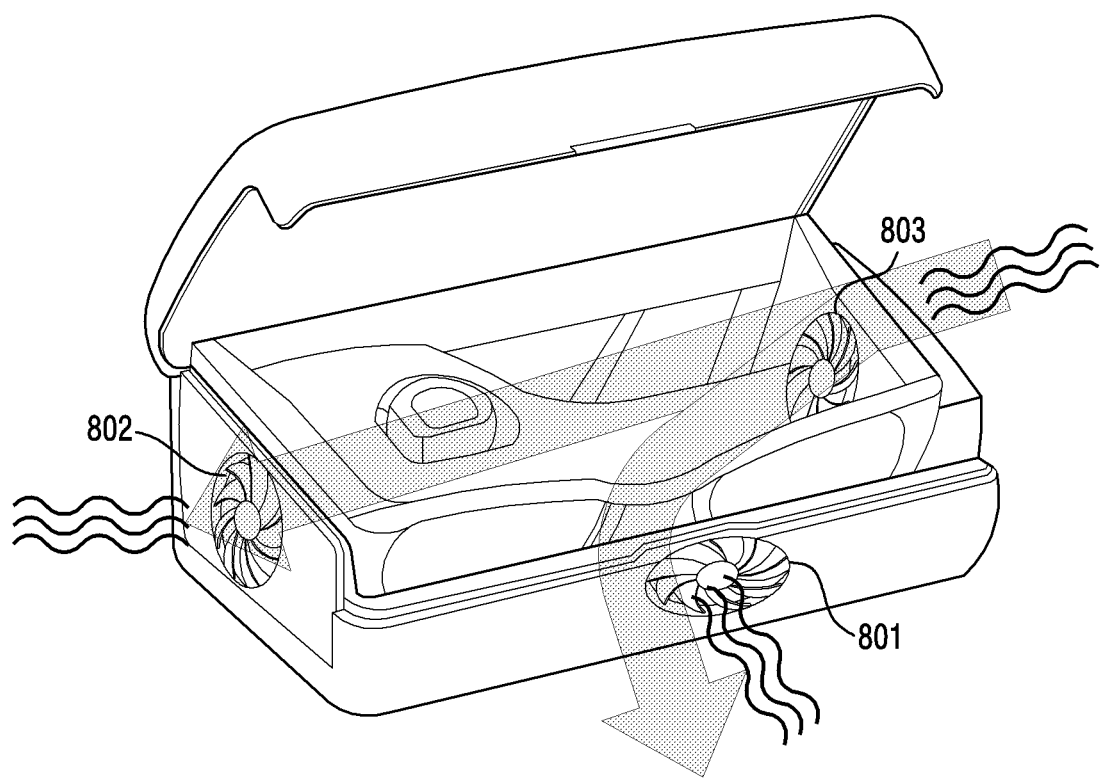
FIG. 8D is a diagram illustrating another example in which an electronic device forms an air flow according to an example embodiment of the disclosure.

FIG. 7 is a flow chart illustrating a control operation 605 of a cooling module (a cooling device) of an electronic device 100 according to an embodiment of the disclosure. FIG. 8A is a diagram illustrating an example in which all multiple cooling modules of an electronic device operate according to an embodiment of the disclosure. FIG. 8B is a diagram illustrating an example in which some of multiple cooling modules of an electronic device operate according to an embodiment of the disclosure. FIG. 8C is a diagram illustrating an example in which an electronic device forms an air flow according to an embodiment of the disclosure. FIG. 8D is a diagram illustrating another example in which an electronic device forms an air flow according to an embodiment of the disclosure.

Referring to FIG. 7 to FIG. 8D, a processor (e.g., the processor 420 in FIG. 4) according to an embodiment of the disclosure may determine whether to operate each cooling device from among a plurality of such cooling devices, based on an operational state in an operation 701. According to an embodiment, the processor 420 may determine whether to operate each cooling device, based on the first control table of <Table 1> and the operational state of an external electronic device. For example, the processor 420 may operate all of the cooling devices 801, 802, and 803, as illustrated in FIG. 8A, in a case of a first operational state in which all multiple heat sources (e.g., the processor 510, the camera 545, and the charging module 550 in FIG. 5) included in an external electronic device (e.g., the external electronic device 500 in FIG. 5) are operated. In a case where some (e.g., the processor 510 and the charging module 550) of the multiple heat sources are operating (e.g., less than an entirety thereof), the processor may operate a subset of the cooling devices 802 and 803 corresponding to some heat sources in operation, as illustrated in FIG. 8B. In FIG. 8A and FIG. 8B, the cooling devices are operated to intake external air into the electronic device, but the disclosure is not limited thereto. At least some of the cooling devices 801, 802, and 803 may be operated to exhaust the internal air to the outside. As another example, if the external electronic device is in a sleep state or a power off state, all of the cooling devices 801, 802, and 803 may be operated to dispel residual heat from operations executed prior to entering the sleep state or the power off state. According to an embodiment, the processor 420 may determine a cooling speed and/or an operation time of each of the cooling devices by referring to the first control table of <Table 1>.

According to an embodiment, the processor 420 may determine a cooling speed (e.g., the speed of a fan), based on temperature in an operation 703. For example, the processor 420 may determine a cooling speed, based on temperature information received from the external electronic device and the control table of <Table 2>. According to an embodiment, the processor 420 may measure temperature through a temperature sensor (e.g., the temperature sensor 470), and determine a cooling speed, based on the measured temperature. According to an embodiment, the processor 420 may combine (e.g., based on an average value) the received temperature information and the temperature measured through the temperature sensor, to determine a cooling speed (e.g., the rotation speed of a fan).

According to an embodiment, the processor 420 may operate at least some of the cooling devices, based on the determination result in an operation 705.

According to an embodiment, the processor 420 may check whether the temperature is lower than a designated reference temperature (e.g., 25 degrees), in an operation 707. For example, the processor 420 may periodically or aperiodically receive temperature information for each of the heat sources from the external electronic device, and monitor whether the temperature of each of the heat sources has decreased as to be lower than the reference temperature. According to an embodiment, the processor 420 may monitor whether the temperature around each of the cooling devices has decreased as to be lower than the reference temperature, using temperature sensors (e.g., the temperature sensor 470) positioned around the cooling devices, respectively. According to an embodiment, the processor 420 may combine (e.g., based on an average value) temperature information received from the external electronic device and temperature measured through the temperature sensor, to detect whether the temperature around each of the cooling devices has decreased as to be lower than the reference temperature.

According to an embodiment, if a result of monitoring in operation 707 indicates that the temperature is not lower than the reference temperature, the processor 420 may return to the operation 701 and repeat the above operations. For example, the processor 420 may maintain the determined control of the cooling devices, or control the cooling devices, based on at least one of an operational state or temperature information of the external electronic device, which changes. For example, the processor 420 may periodically or aperiodically identify temperature, and reduce a cooling speed (e.g., the rotation speed of a fan) according to reduction of the temperature as shown in the second control table of <Table 2>. This may reduce noise generated by high speed rotation of the fan.

According to an embodiment, if a result of checking in the operation 707 indicates that the temperature is lower than the reference temperature, the processor 420 may deactivate at least some of the activated cooling devices in an operation 709. For example, the processor may terminate the operation of the first cooling device 801 when the temperature of the camera module is reduced to be lower than the reference temperature. According to an embodiment, the processor 420 may control the cooling devices to change air flow directionality. For example, the processor 420 may control (e.g., rotate the fan in the reverse direction), as illustrated in FIG. 8C, the first cooling device 801 to exhaust the internal air to the exterior so as to form an air flow in which air introduced through the second cooling device 802 and the third cooling device 803 is exhausted through the first cooling device 801. When the temperatures of the heat sources corresponding to the second cooling device 802 and the third cooling device 803 reach a predesignated temperature (e.g., about 33 degrees), the processor 420 may terminate the formation of the air flow through the first cooling device 801, and may maintain operation of the second cooling device 802 and the third cooling device 803. This may reduce noise.

As another example, the processor 420 may terminate the operation of the first cooling device 801 and the second cooling device 802 when the temperatures of the camera module and the processor have decreased as to be lower than the reference temperature. According to an embodiment, the processor 420 may control, as illustrated in FIG. 8D, the first cooling device 801 and the second cooling device 802 to form an air flow in which air introduced through the third cooling device 803 is exhausted to the external environment through the first cooling device 801 and the second cooling device 802. When the temperature of the heat source corresponding to the third cooling device 803 reaches a predesignated temperature (e.g., about 33 degrees), the processor 420 may terminate the formation of the air flow through the first cooling device 801 and the second cooling device 802, and maintain operation of the third cooling device 803. This may reduce noise.

In FIG. 8A to FIG. 8D, the electronic device is illustrated to be opened, but this is merely for convenience of explanation, and the electronic device may operate (or drive) the cooling devices in a closed state. In addition, in FIG. 8A to FIG. 8D, the cooling devices 801, 802, and 803 are illustrated to be exposed to the external environment, but the cooling devices may be hidden by the discharge holes 101, 102, and 103 as shown in FIG. 1 and FIG. 2.

According to certain embodiments of the disclosure, a method for controlling at least one cooling module (e.g., the cooling module 460 in FIG. 4) of an electronic device (e.g., the electronic device 100 in FIG. 1 and FIG. 2, or the electronic device 400 in FIG. 4) may include sensing, through a detection module (e.g., the detection module 440 in FIG. 4), that an external electronic device (e.g., the external electronic device 200 in FIG. 3 or the external electronic device 500 in FIG. 5) is received in a housing (e.g., the first housing 110 and the second housing 120 in FIG. 1), acquiring at least one of operational state information or temperature information of the external electronic device in response to the sensing of the reception, and controlling the at least one cooling module, based on the at least one of the operational state information or the temperature information.

According to certain embodiments, the operational state information may include first operational state information indicating that all multiple heat sources included in the external electronic device are operating, second operational state information including information relating to some heat sources which are operating among the multiple heat sources, and third operational state information indicating that all the multiple heat sources are not operating.

According to certain embodiments, the electronic device may include, as the at least one cooling module, multiple cooling modules. The controlling of the at least one cooling module may include operating all or some of the multiple cooling modules, based on the operational state information.

According to certain embodiments, the temperature information may include temperature information of each of multiple heat sources included in the external electronic device. The controlling of the at least one cooling module may include controlling the at least one cooling module, based on the temperature information of each of the heat sources.

According to certain embodiments, the acquiring of the temperature information may include at least one of receiving the temperature information from the external electronic device or measuring temperature through at least one temperature sensor (e.g., the temperature sensor 470 in FIG. 4) disposed around the at least one cooling module.

According to certain embodiments, the method may further include measuring temperature around each cooling module through the at least one temperature sensor, and based on a result of the measurement, stopping a cooling module corresponding to a heat source having a temperature lower than a second designated reference temperature, or controlling a cooling direction of the corresponding cooling module to form an air flow for another heat source having the second reference temperature or higher.

According to certain embodiments, the at least one cooling module may be disposed in the housing to correspond to a heat source of the external electronic device when the external electronic device is received.

According to certain embodiments, the controlling of the at least one cooling module may include checking whether a battery of the electronic device shows a first designated reference level or higher, performing control of the at least one cooling module when the battery shows the first reference level or higher, identifying a battery level of the external electronic device when the battery shows a level lower than the first reference level, and deactivating the at least one cooling module when the battery level of the external electronic device is lower than a second designated reference level.

It should be appreciated that certain embodiments of the disclosure and the terms used therein are not intended to limit the technological features set forth herein to particular embodiments and include various changes, equivalents, and/or alternatives for a corresponding embodiment. With regard to the description of the drawings, similar reference numerals may be used to designate similar or relevant elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may be interchangeably used with other terms, for example, "logic," "logic block," "component," or "circuit". The "module" may be a minimum unit of a single integrated component adapted to perform one or more functions, or a part thereof. For example, according to an embodiment, the "module" may be implemented in the form of an application-specific integrated circuit (ASIC).

Certain embodiments as set forth herein may be implemented as software (e.g., program) including one or more instructions that are stored in a storage medium that is readable by a machine. For example, a processor (e.g., the processor 420, 510) of the machine may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each element (e.g., a module or a program) of the above-described elements may include a single entity or multiple entities. According to certain embodiments, one or more of the above-described elements may be omitted, or one or more other elements may be added. Alternatively or additionally, a plurality of elements (e.g., modules or programs) may be integrated into a single element. In such a case, according to certain embodiments, the integrated element may still perform one or more functions of each of the plurality of elements in the same or similar manner as they are performed by a corresponding one of the plurality of elements before the integration. According to certain embodiments, operations performed by the module, the program, or another element may be carried out sequentially, in parallel, repeatedly, or heuristically, or one or more of the operations may be executed in a different order or omitted, or one or more other operations may be added.

The invention claimed is:

1. An electronic device, comprising:
a housing including an inner space for accommodating an external electronic device therein;
a battery disposed in the housing;
a detection module disposed in the housing, and configured to detect one of accommodating or removal of the external electronic device from the inner space;
a communication module disposed in the housing, and configured to receive at least one of an operational state information or temperature information for the external electronic device from the external electronic device;
at least two cooling modules disposed in the housing, the at least two cooling modules including a first cooling module positioned at a first side of the housing and a second cooling module positioned at a second side of the housing;
at least one processor operatively coupled with the detection module, the communication module and the at least two cooling modules; and
memory operatively coupled with the at least one processor,
wherein the memory stores instructions which, when executed by the at least one processor, cause the electronic device to:
detect, through the detection module, that the external electronic device is accommodated in the housing,
receive at least one of the operational state information or temperature information for the external electronic device through the communication module while the external electronic device is being accommodated,
control each one of the at least two cooling modules based on the operational state information or the temperature information; and
control each one of the at least two cooling modules to change an air flow direction among a plurality of possible air flow directions for dissipating heat generated from the external electronic device to outside of the housing by changing whether air ingresses or egresses the housing through at least one of the at least two cooling modules.

2. The electronic device of claim 1, wherein the operational state information comprises one of a first operational state information, in which all heat sources in the external electronic device are operative, a second operational state information, in which some heat sources are operative less than all of the heat sources, or a third operational state information indicating that all of the heat sources are inoperative.

3. The electronic device of claim 2, wherein the at least one processor operates all or some of the at least two cooling modules based on the operational state information.

4. The electronic device of claim 1, wherein the temperature information includes respective temperatures for each of a plurality of heat sources included in the external electronic device, wherein each one of the at least two cooling modules is located at a respective position of the housing that corresponds to the plurality of heat sources of the external electronic device, and wherein the at least one processor controls each one of the at least two cooling modules, based which ones of the plurality of heat sources the temperature information indicates as having a temperature exceeding a predetermined temperature.

5. The electronic device of claim 1, further comprising a plurality of temperature sensors disposed proximate to the at least two cooling modules, wherein the at least one processor receives the temperature information from the external electronic device, or acquires the temperature information using a plurality of temperature sensors in response to detecting of the accommodated external electronic device.

6. The electronic device of claim 5, wherein the instructions, when being executed by the at least one processor, cause the electronic device to:

measure a respective temperature of each cooling module from among the at least two cooling modules using at least one temperature sensor, and based on a result of the measurement, execute one of:
terminating operation of each cooling module corresponding to a heat source having a temperature lower than a second reference temperature, and
control an orientation of each cooling module to change an air flow direction such that cooling is directed at a corresponding heat source having a temperature greater than or equal to the second reference temperature.

7. The electronic device of claim 1, wherein the at least two cooling modules are disposed in the housing to align to a heat source of the external electronic device when the external electronic device is accommodated.

8. The electronic device of claim 1, wherein the instructions, when being executed by the at least one processor, cause the electronic device to:

detect a charge level of the battery, identify whether the charge level is greater than or equal to a first reference level, based on identifying that the charge level is greater than or equal to the first reference level or higher, control activation of the at least two cooling modules, based on identifying that the charge level is less than the first reference level, identify whether a battery level of the external electronic device is less than a second reference level, and, based on identifying that the battery level of the external electronic device is less than the second reference level, control deactivation of the at least two cooling modules.

9. A method for controlling at least two cooling modules of an electronic device, the method comprising:

detecting, using a detection module of the electronic device, that one of accommodating or removal of an external electronic device from an inner space defined within a housing of the electronic device;

receiving at least one of an operational state information or temperature information for the external electronic device from the external electronic device through a communication module of the electronic device, while the external electronic device is being accommodated;

controlling each one of the at least two cooling modules based on the operational state information or the temperature information; and controlling each one of the at least two cooling modules to change an air flow direction among a plurality of possible air flow directions for dissipating heat generated from the external electronic device to outside of the housing by changing whether air ingresses or egresses the housing through at least one of the at least two cooling modules, wherein the at least two cooling modules include a first cooling module positioned at a first side of the housing and a second cooling module positioned at a second side of the housing.

10. The method of claim 9, wherein the operational state information comprises one of:

a first operational state, in which all heat sources in the external electronic device are operative, a second operational state, in which some heat sources are operative less than all of the heat sources, and a third operational state indicating that all of the heat sources are inoperative.

11. The method of claim 10, wherein controlling the operation of the at least two cooling modules comprises operating all or some of the at least two cooling modules based on the operational state information.

12. The method of claim 9, wherein the temperature information includes respective temperatures for each of a plurality of heat sources included in the external electronic device, wherein each one of the at least two cooling modules is located at a respective position of the housing that corresponds to the plurality of heat sources of the external electronic device, and wherein the operation each one of the at least two cooling modules is based on which one of the plurality of heat sources the information indicates as having a temperature exceeding a predetermine temperature.

13. The method of claim 11, wherein receiving the temperature information comprises at least one of:

receiving the temperature information from the external electronic device; or acquiring the temperature information using a plurality of temperature sensors disposed proximate to the at least two cooling modules in response to detecting of the accommodated external electronic device.

14. The method of claim 13, further comprising:

measuring a respective temperature of each cooling module from among the at least two cooling modules using the plurality of temperature sensors, and based on a result of the measurement, executing one of:
terminating operation of each cooling module corresponding to a heat source having a temperature lower than a second reference temperature, and
control an orientation of each cooling module to change an air flow direction such that cooling is directed at a corresponding heat source having a temperature greater than or equal to the second reference temperature.

15. The method of claim 9, wherein the at least two cooling modules are disposed in the housing to align to a heat source of the external electronic device when stowed within the inner space.

16. The method of claim 9, further comprising:
detecting a charge level of a battery,
identifying whether the charge level is greater than or equal to a first reference level,
based on identifying that the charge level is greater than or equal to the first reference level or higher, controlling activation of the at least two cooling modules,
based on identifying that the charge level is less than the first reference level, identifying whether a battery level of the external electronic device is less than a second reference level, and,
based on identifying that the battery level of the external device is less than the second reference level, controlling deactivation of the at least two cooling modules.

17. An electronic device, comprising:
a housing;
a plurality of heat sources;
an interface module disposed in the housing and operatively connected to an external device when the electronic device is accommodated in the external device;
a communication module;
at least two cooling modules disposed in the housing, the at least two cooling modules including a first cooling module positioned at a first side of the housing and a second cooling module positioned at a second side of the housing;
at least one processor operatively coupled with the interface module, the communication module and the at least two cooling modules; and
memory operatively coupled with the at least one processor,
wherein the memory stores instructions which, when executed by the at least one processor, cause the electronic device to:
detect reception in the external device through the interface module, and
based on detecting the reception in the external device, transmit temperature information of the plurality of heat sources to the external device through the communication module in response to detecting of the reception in the external device,
control each one of the at least two cooling modules to change an air flow direction among a plurality of possible air flow directions for dissipating heat generated from the external device to outside of the housing by changing whether air ingresses or egresses the housing through at least one of the at least two cooling modules.

18. The electronic device of claim 17, wherein the instructions, when being executed by the at least one processor, cause the electronic device to: periodically transmits the temperature information to the external device through the communication module.

19. The electronic device of claim 17, further comprising a battery,
wherein the instructions, when being executed by the at least one processor, cause the electronic device to: transmit a charge level of the battery to the external device when the charge level of the battery is less than a predesignated reference value.

20. The electronic device of claim 17, wherein the temperature information includes respective temperatures for each of the plurality of heat sources, and
wherein operational state information comprises one of:
a first operational state information, in which all heat sources in the electronic device are operative,
a second operational state information, in which some heat sources are operative less than all of the heat sources, and
a third operational state information indicating that all of the heat sources are inoperative.

* * * * *